United States Patent [19]

Krueger

[11] 4,270,260

[45] Jun. 2, 1981

[54] METHOD FOR THE SALVAGE AND RESTORATION OF INTEGRATED CIRCUITS FROM A SUBSTRATE

[76] Inventor: Ellison F. Krueger, 3916 Grand View, Tempe, Ariz. 85281

[21] Appl. No.: 949,763

[22] Filed: Oct. 10, 1978

[51] Int. Cl.³ .......................................... B23Q 17/00
[52] U.S. Cl. ................................ 29/403.4; 228/191; 228/119
[58] Field of Search ................. 228/191, 119; 29/403, 29/403.4

[56] References Cited

U.S. PATENT DOCUMENTS

| | | | |
|---|---|---|---|
| 3,557,430 | 1/1971 | Jones | 29/203 |
| 3,684,151 | 8/1972 | Burman | 228/19 |
| 3,879,836 | 4/1975 | Coffin | 29/427 |
| 4,022,370 | 5/1977 | Durney | 228/191 |

OTHER PUBLICATIONS

"Repair of Integrated Circuits", *Western Electric Technical Digest No. 3*, Jul. 1966, Drexinger, p. 11.
IBM Technical Disclosure Bulletin, vol. 13, No. 7, Dec. 1970, pp. 1811, 1812, ("Infrared Chip Repair Tool'"—Beliveau et al.)

*Primary Examiner*—Nicholas P. Godici
*Assistant Examiner*—V. K. Rising
*Attorney, Agent, or Firm*—Drummond and Nelson

[57] ABSTRACT

Components such as IC's mounted on a substrate such as a PCB are removed from the PCB in a heating apparatus. The heating apparatus has a mounting frame which positions the PCB above an array of infra red heating sources. The method includes the steps of bombarding the PCB with infra red energy which is absorbed and conducted to the solder joints to melt the solder to permit extraction of the components.

5 Claims, 5 Drawing Figures

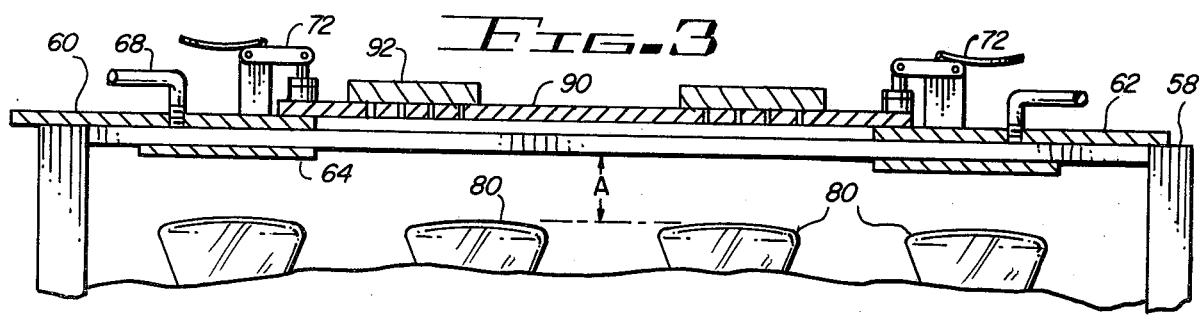
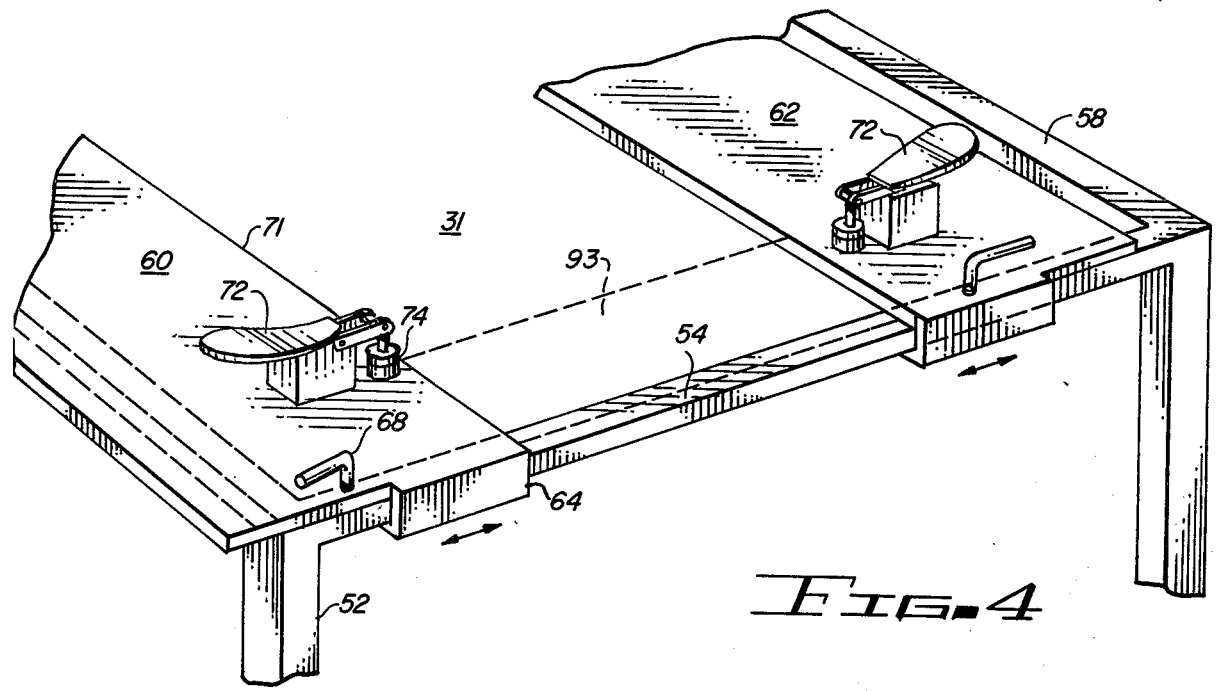
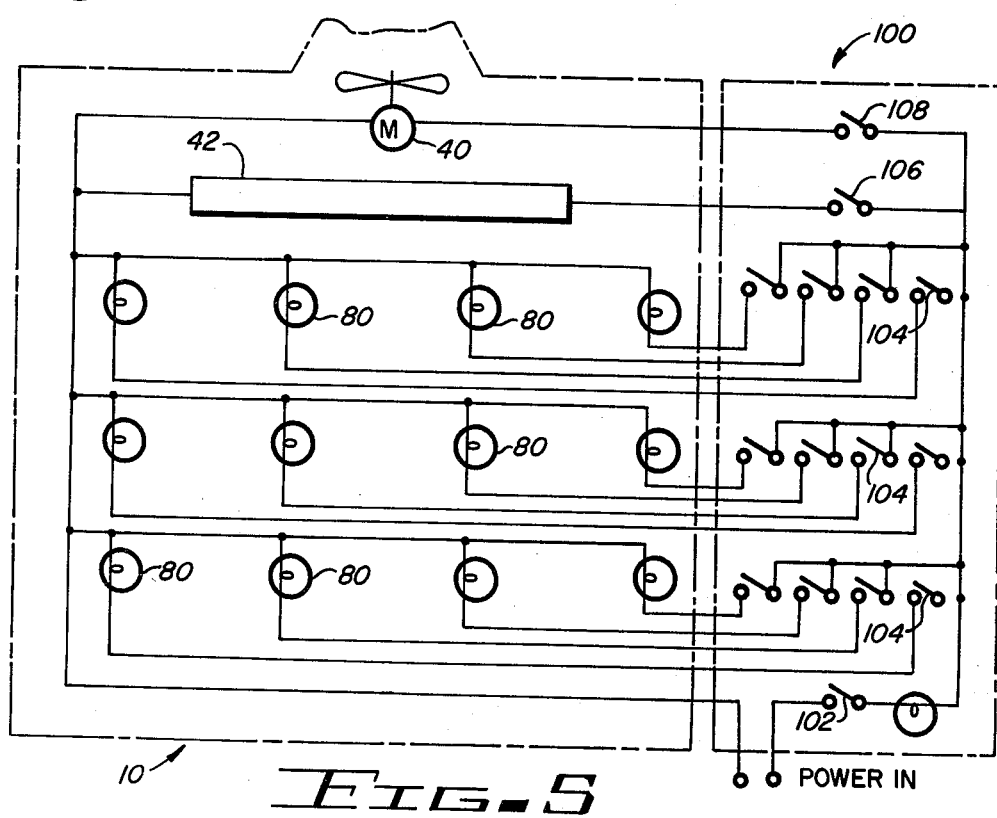

METHOD FOR THE SALVAGE AND RESTORATION OF INTEGRATED CIRCUITS FROM A SUBSTRATE

The present invention relates to an apparatus for removing an electronic component, such as an integrated circuit, from a substrate, such as a printed circuit board, to which the component has been secured by solder.

Solid state electronic circuit containing components fabricated as individual units are termed integrated circuits (IC). An integrated circuit generally includes a body in which the solid state elements are housed from which project a number of interconnecting leads. Integrated circuit packages are usually mounted on a printed circuit board (PCB). The printed circuit board or substrate provides the interconnecting circuitry between circuit components such as resistors, capacitors, diodes, transistors and the like with the integrated circuits. The leads of the integrated circuits are fitted into holes formed within the printed substrate.

The most usual method of fabrication of circuit patterns is to use both sides of the circuit board for wiring. Printed circuits are usually made of copper foil cemented on epoxy-glass boards. The process in most current use today employs a device for imparting the wave-like motion to the solder bath to effectuate the connection and cause the conductive leads to become mechanically and electrically integral with the circuit.

Future trends in systems packaging is to forming assemblies by connecting semi-conductor chips with vacuum deposited metal conductors, resistors and capacitors using thin film technology.

Another approach is the thick film circuit in which the conductor strips and resistors are deposited by printing using screening masks and inks which consist of colloidal metals and metal oxides mixed with organic binders. After painting, the substrate is fired at appropriate temperatures and the circuit is encapsulated.

The problems of removal of IC's for repair or restoration are substantial with the techniques described above for attaching integrated circuits to a board or substrate. Conventionally, when necessary to remove a resistor, diode, transistor or the like from a substrate, the leads are heated causing the solder to reflow and the component is pryed loose from the board. Alternately, components were cut from the board. These techniques have proved to be expensive and wasteful and are not always applicable to integrated circuits. It is difficult to heat the lead or leads to the integrated circuit by conventional means without damaging the IC's and mechanical removal and replacement is not practical. Thus it has not been generally feasible to recover and salvage functional IC's from PCB's when the PCB has been removed because of a restoration or failure of another component.

Some attempts have been made to provide apparatus and methods for removal of components and IC's in such a manner as to permit recovery and restoration of the components. U.S. Pat. No. 3,557,430 shows an apparatus for removing a component from a substrate to which it has been soldered utilizing a concentrated source of heat encompassing the solder connections. The substrate is located approximate to the heat source and a tension device is secured to the component and removes the component when the solder connections are exposed to the heat source.

A somewhat similar approach is shown in U.S. Pat. No. 3,684,151 which discloses a soldering machine for removing IC's from printed circuit boards. The apparatus includes a closed bath of molten solder having a passage leading from the bath. The printed circuit board is secured in a positioning frame at the open end of the passage and guided by a template so that the circuit element has the soldered leads positioned over the opening. When in this position, a plunger displaces a portion of the solder and the molten solder level in the passage rises to contact the leads to facilitate removal of the leads.

While both of the foregoing techniques are effective, they are inconvenient in that they utilize a molten solder bath. Further, the techniques require a positioning apparatus to isolate a portion of the printed circuit board and therefore are not adaptable to efficient high rate removal and restoration of components. Further, use of molten solder bath as practiced in these patents can result in damage to the components.

U.S. Pat. No. 3,878,936 shows a more recent development in which the printed circuit board is held in airtight contact in a vessel. A vacuum source is applied to the vessel and a point source of heat is applied to each lead. When the solder is melted, the vacuum valve is opened and air rushes outwardly to drive the leads out of the holes. Again, the technique of this patent requires point source application of heat by a soldering gun, alcohol torch or other apparatus which is insufficient.

The present invention relates to a unique and efficient process for removal of IC's with minimal damage and so that substantially all of the removed components can be salvaged for reuse. Briefly, the apparatus of the present invention includes an infrared heat source and a mounting frame for securing the boards in a position to absorb the infrared energy and effect heating. Energy is absorbed by the darker non-reflective PCB board material and conducted to the shiny reflective solder joints, effecting an even, gentle temperature rise. Temperature control is maintained by inducing a flow of air across the printed circuit board which flow of air may be regulated by a louver and duct system. When the solder joints reach melting temperature, an extraction tool can be used to remove the IC's. The method of the present invention basically comprises steps of cleaning and pretreating the PCB's and thereafter securing the PCB's in the mounting frame. The boards are exposed to infrared energy which is absorbed and conducted to the solder joints to heat the joints to a temperature required for melting the specific solder used in the PCB assembly. By using infrared, the ambient air remains tolerable to human comfort. This temperature range is controlled by inducing a flow of air across the PCB's. The components can be extracted when the solder melting temperature is reached at the solder joints and thereafter the components can be subjected to any necessary treatment such as cleaning, tinning and straightening of leads.

The present invention will be more fully understood from the following description, claims and drawings in which:

FIG. 3 is a sectional view of the heating apparatus taken along lines 3—3 of FIG. 1;

FIG. 4 is a fragmentary perspective view of a portion of the mounting clamp frame for securing PCB's in the desoldering apparatus; and FIG. 5 is a schematic of the electrical system utilized in accordance with the present invention.

Figure 1:
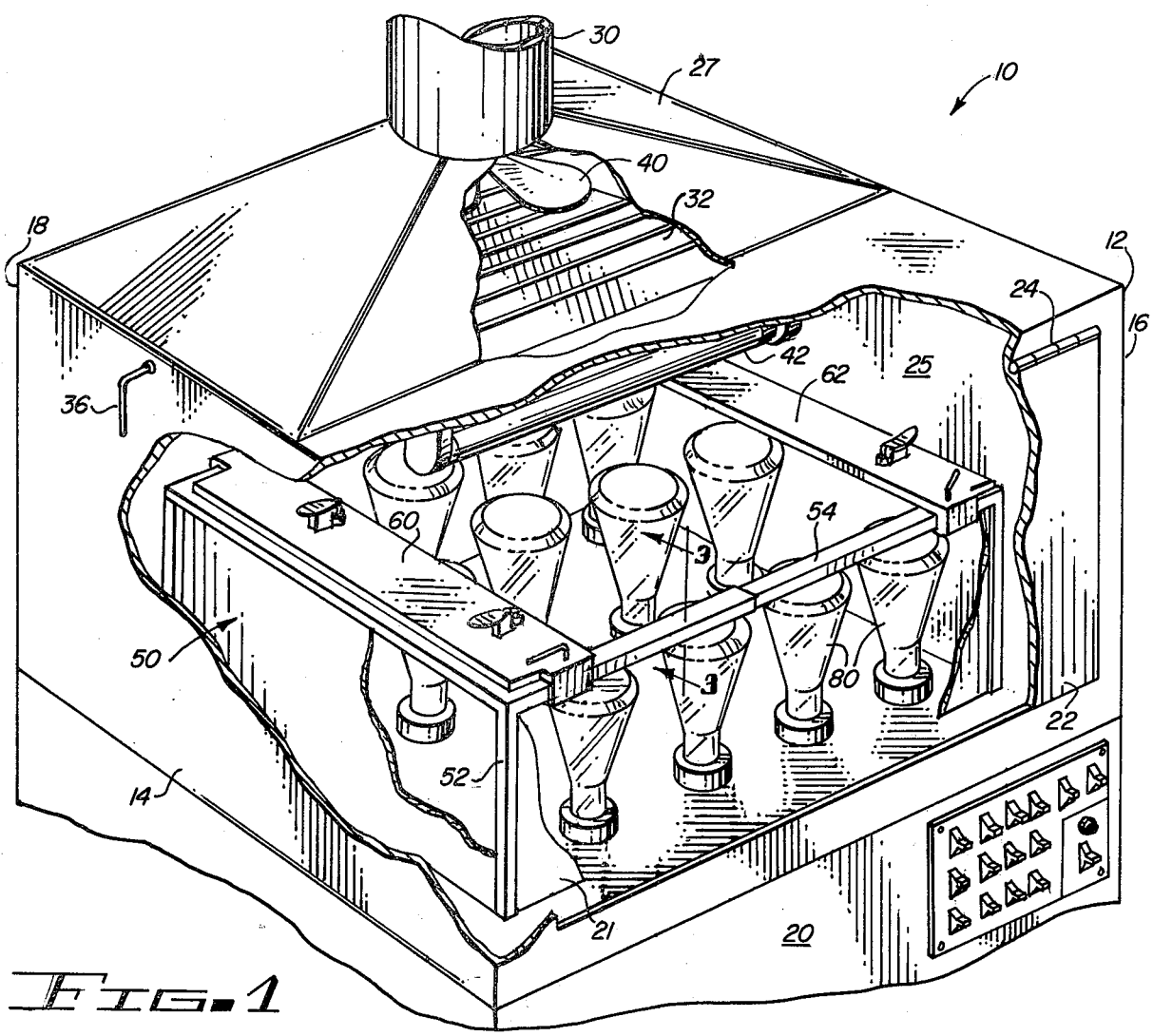
FIG. 1 is a perspective, fragmentary view illustrating the desoldering apparatus of the present invention.

The desoldering apparatus of the present invention is shown in FIGS. 1, 3 and 4. The desoldering apparatus of the present invention is generally designated by the numeral 10 and includes a housing 12 which is generally rectangular having opposite side walls 14 and 16, rear walls 18 and front wall 20. An access door 22 is hingedly affixed to front wall 20 at piano-type hinges 24 to provide access to the processing chamber 25. A hood 27 is secured to the walls 14, 16, 18 and 20 at the upper edges of the walls and converges upwardly terminating at the cylindrical exhaust vent 30. A series of horizontally extending louvers 32 are mounted within hood 28 and are adjustable by a means of louver control lever 36 extending through side wall 14. In a closed position, louvers 32 overlap to effectively restrict airflow to the vent 30. An exhaust fan 40 is mounted above louvers 32 near the entrance to exhaust vent 30. Illuminating means 42 shown as a flourescent light tube is mounted to flow louvers 32 in the upper part of chamber 25 to illuminate the interior of the chamber.

A circuit board mounting assembly is generally designated by the numeral 50 and is positioned within chamber 25 and is best seen in FIG. 4. The mounting assembly 50 includes a frame assembly having vertical corner posts 52 generally disposed in a rectangular pattern which support transverse rails 54 disposed in parallel relationship at the front and rear of the chamber. Frame members 58 extend between the posts 52 at opposite sides of the mounting assembly 50. The frame members 58 and rails 54 define a generally rectangular work area 31. A pair of cover plates 60 and 62 are slideably disposed on rails 54. Each of the plates 60 and 62 are substantially the same so description of one of the plates 60 is sufficient and will serve to describe both plates. Plate 60 is generally rectangular having a guide member 64 engaging rail 54 at both ends of the plate 60. The plate 60 can be horizontally moved along the rail 54 laterally within chamber 25. Plate 60 has a width that is selected so that when the cover plates 60 and 62 are moved laterally together, the work area 31, defined by frame members 54 and 58 is substantially covered by the plate. A locking screw 68 is in threaded engagement with plate 60 and is positioned to align with rails 54 so that the plate may be locked in any desired position along the rails 54. Reflective panels 21 enclose the array of heat sources.

A pair of clamps are shown spaced-apart and dispose near the inner edge 71 of the plate 60. The clamps 72 are shown as conventional toggle-type clamps of the over-center type having a foot 74 which will serve to hold PCB 90 having IC components 92 in tight engagement against the upper surface of plate 60 when the toggle is in the closed position as shown in FIG. 3.

An array of heat sources 80 are shown disposed below plates 60 and 62 within the confines of the mounting plate assembly 50. The heat sources are shown as individual infrared heat lamps such as 250 watt lamps. The wattage and size of the lamps may be varied, 250 watt lamps being practical because of commercial availability. With 250 watt lamps individual infrared lamps would typically be positioned a distance of not less than 1½ nor more than 2½ inches from the bottom side of the printed board and a plane tangent to the top most point on the infrared lamps and spaced to effectively heat the PCB's. Spacing would accordingly vary with other size lamps.

The electrical system is diagrammed schematically in FIG. 5 and includes control panel 100 having main power switch 102. The individual heat sources 80 are controlled by a plurality of switches 104. Similarly, light 42 and exhaust fam 40 are respectively controlled by switches 106 and 108. The details of the electrical control system are well-known to those in the art and therefore detailed description is not believed necessary.

The apparatus of the present invention will be more fully understood from the following description of the method of the present invention as carried out by the apparatus shown in FIGS. 1, 3 and 4.

Figure 2:
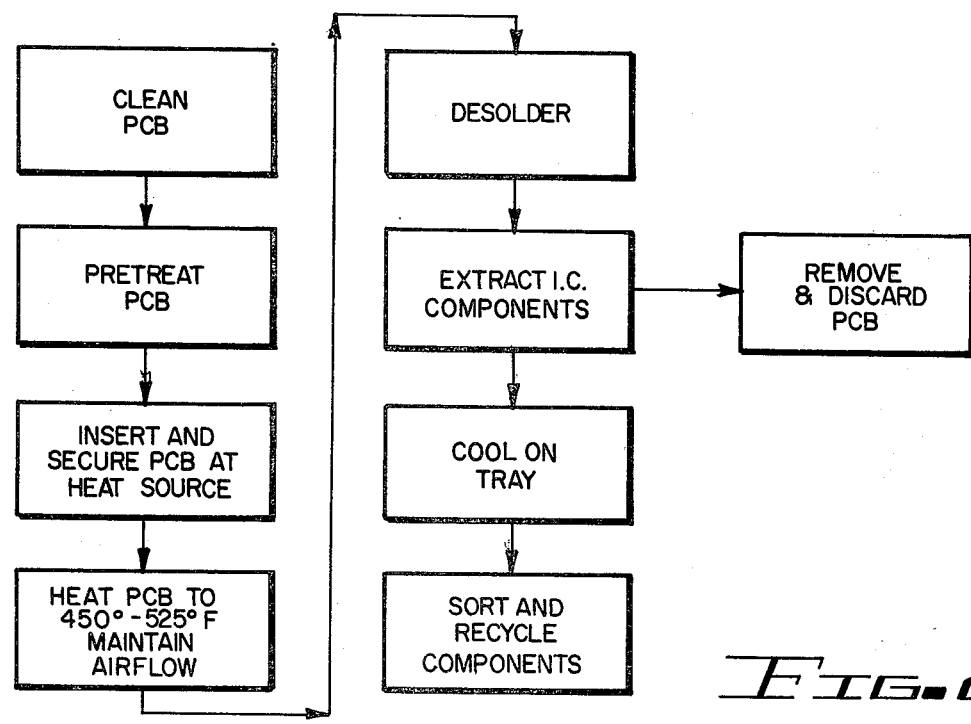
FIG. 2 illustrates in schematic fashion the method of the present invention.

Printed circuit boards come in various sizes and will contain various components such as resistors, capacitors, diodes and integrated circuits which may be of various types such as plastic dual in line, flat pack, ceramic dual in line and metal can integrated circuits. The integrated circuits can be of various generic types such as TTL, MOS, MECL, linear storage and the like. FIG. 3 illustrates a typical printed circuit board 90 having IC components 92 secured to the board with pins extending through the board and soldered in place. The steps involved in the process of the present invention are best illustrated in FIG. 2. The first operation is to prepare the boards as necessary. If the bottom of the boards are excessively contaminated, the boards must be first washed in an appropriate solution such as methyl alcohol or a 1,1,1-trichoroethane solution heated to approximately 120° F. The latter washing is necessary only if contamination is severe. The boards may then be rinsed in ambient Freon TMC after washing. If the top side of the board is also excessively contaminated and total immersion of the board is necessary, then 1,1,1-trichloroethane should be used only after it is determined that the solution will not adversely affect the component marking.

The top side of a double sided PCB may need pre-treatment with flux to enhance heat transfer during desoldering, especially if SN5 or other high temperature solders have been used to secure the components in place. Typical flux for this purpose would be Kester 197 or an equivalent moderately active flux.

Once the board has been cleaned and pre-treated if necessary, any mechanical hardware components such as bolts, nuts, components, sockets and the like should be removed. Similarly, any plastic parts on the bottom side of the PCB which might melt or burn should also be removed at this stage. Once these steps are completed, the board can be placed in processing chamber 25 on the mounting assembly 50. The board is placed in position and mounting plates 60 and 62 are laterally moved so the edges of the board are engaged by the toggle fasteners 72. The toggle fasteners can be locked in place as best shown in FIG. 3 securing the board in a generally horizontal position. The board should be approximately centered over the array of infrared heat sources 80. If the board is narrow and does not extend substantially the length of mounting plates 60 and 62, any spaces at the edge of the boards can be locked by appropriate inserts 92 as shown in FIG. 4.

The array of heat sources is initially selected to conform with the PCB configuration. The lamps should be positioned a predetermined distance from the plane of the bottom side of the PCB and a plane tangent to the top most point of the infrared bulbs as represented by the dimension A in FIG. 3 in order to heat the PCB efficiently without burning the PCB. The plane of the bottom of the board and the plane tangent to the upper surfaces of the heat sources should be substantially parallel. In the event the board should have an obstructing or extremely heavy component, such component should be removed during preparation to prevent excessive warpage shich could lead to serious heat differentials.

Once the board is secured in place in the processing chamber 25, as shown, the heat sources 80 are energized and the fan 40 is actuated. The array of heat sources serves to maintain a bombardment of infrared energy upon the surface of the PCB during the desoldering operation substantially constant. Normally, commercial bulbs provide a substantially uneven intensity of the infrared bombardment over the area which they project. The center tends to get more intensity than the periphery. To meet this problem, the area at the top where the board fits in between the mounting plates, all inside surfaces of the mounting frame and support assembly are enclosed with panels 21 and inserts 92 having an inner surface of a highly reflective material such as aluminum foil. The material can be removed and changed when it reaches a point of tarnish that reduces its reflectiveness. The reflective foil tends to reduce the bombardment intensity differential.

The printed circuit board 90 is tightly secured against the mounting frame forming a seal so that the interior of the mounting frame forms an efficient oven. The ambient temperature immediately below the PCB surface is maintained at about 350° and helps to maintain constancy and also speeds up initial board heating. The PCB absorbs energy and heats up and the solder joints are, in turn, heated to melting by conduction from the board. The exact melting temperature of the solder varies somewhat with the type of solder.

The exhaust fan 40 regulates the rate of air flow and air flow convection over the surface of the board and helps to keep the IC's and other components cool so they are not damaged. The rate of air flow can be regulated by the louvers by manipulation of adjustment handle 36. Precise setting of the louvers must be determined by trial and error to prevent build-up of excessive temperatures and to maintain the temperatures within the prescribed range of the solder used in the PCB assembly. The exhaust system also serves to protect the operator from fumes which may be emitted in the desoldering process and discharges excess heat to prevent operator discomfort.

Once the PCB is heated to the required temperature range and the solder heated to its melting point by conduction of heat to the joints, the IC's 92 can be removed by an extraction tool. The extraction tool may be simply a pair of tongs. The desoldering devices must be allowed to cool to a temperature of about 300° or below before being placed in a massive salvage device otherwise the leads will often wet together to form a soldered joint. For this reason, extracted devices are usually dropped into a cooling tray where they are not congested and the leads will not touch and bond together.

Thereafter, PCB's 90 can be removed and discarded. The IC's are sorted into pin compatible functions, for example, generically into related families such as TTOL, MOS, MECL, linear storage, etc. A specific sort may follow.

Mechanical repair may be necessary which, for example, includes pin straightening. The leads in the devices may be tinned. For non-oxidized leads it is best to dip the device into an appropriate heated solder such as SN 63 solder at about 500° F. Oxidized leads usually first require fluxing with an appropriate flux such as Kester 1544 and then the leads can be dipped into solder as described above.

Cleaning may be necessary and this can be accomplished by soaking the devices for an appropriate length of time, as for example, two to five minutes in methyl alcohol and transferring to a Freon TMC bath in which mild agitation is imparted. The components can then be retrieved from the bath and allowed 30 seconds drying time.

The apparatus and method of the present invention has particular applicability to PCB components which have been soldered into PCB and at some later date removed because of a proprietary reclamation process. The components are in the same usable condition as when they were new. The present invention has been applied to approximately 1,000,000 components comprising more than 300 different devices which have been desoldered and functionally tested, including TTL, MOS, CMOS, transistors, resistor arrays, sockets, pin connectors, switchpots and almost every other conceivable type of component. The reclamation process experiences has yielded over 90% recovery after visual and functional testing.

It will be apparent that many changes, alterations and modifications may be made in the method and apparatus according to the principles of the present invention. Other mounting arrangements can be employed for securing the PCB in place in the desoldering apparatus and the method may employ various apparatus. To the extent that these changes, alterations and modifications do not depart from the spirit and scope of the appended claims, they are intended to be encompassed therein.

I claim:

1. A salvage method for simultaneously desoldering a plurality of electronic components mounted on a substrate at solder joints such as a PCB, said method comprising:
   (a) exposing at least a substantial portion of the surface of the PCB to bombardment by infra red energy to heat the board to a temperature appropriate to effect a substantially even temperature rise causing melting of the solder securing said components;
   (b) controlling the temperature of the PCB by maintaining a controlled flow of air across a surface of the PCB; and
   (c) thereafter removing the selected components from the board.

2. The method of claim 1 including the steps of pretreating the board prior to heating by washing the board in an appropriate solvent.

3. The method of claim 1 including the additional steps of sorting the removed component into related families and accomplishing any necessary mechanical repair to the extracted components.

4. The method of claim 1 wherein said heating is accomplished on a frame which disposes said board in a position substantially parallel to the upper terminus of said heat source.

5. The method of claim 4 in which said heat source is substantially enclosed by reflective material to reduce the bombardment intensity differential.

* * * * *